(12) United States Patent
Mouridsen et al.

(10) Patent No.: US 12,719,306 B2
(45) Date of Patent: Aug. 25, 2026

(54) METHOD TO OPERATE PARALLEL BYPASS THYRISTORS AT LOW LOAD

(71) Applicant: SCHNEIDER ELECTRIC IT CORPORATION, Foxboro, MA (US)

(72) Inventors: Jonas Sonsby Mouridsen, Odense V (DK); Kasper Tellerup, Odense V (DK)

(73) Assignee: Schneider Electric IT Corporation, Foxborough, MA (US)

( * ) Notice: Subject to any disclaimer, the term of this patent is extended or adjusted under 35 U.S.C. 154(b) by 0 days.

(21) Appl. No.: 19/043,738

(22) Filed: Feb. 3, 2025

(65) Prior Publication Data

US 2025/0246930 A1 Jul. 31, 2025

Related U.S. Application Data

(63) Continuation of application No. 18/211,683, filed on Jun. 20, 2023, now Pat. No. 12,244,174.

(51) Int. Cl.
*H02J 9/06* (2006.01)
*H03K 17/13* (2006.01)

(52) U.S. Cl.
CPC ............ *H02J 9/068* (2020.01); *H03K 17/136* (2013.01)

(58) Field of Classification Search
CPC ............................... H02J 9/068; H03K 17/136
See application file for complete search history.

(56) References Cited

U.S. PATENT DOCUMENTS

| | | | | |
|---|---|---|---|---|
| 5,808,378 | A | 9/1998 | O'Leary | |
| 8,896,152 | B2 | 11/2014 | Beg et al. | |
| 9,806,560 | B2 * | 10/2017 | Navarro | H02J 9/06 |
| 9,831,675 | B2 | 11/2017 | Colombi et al. | |
| 2005/0184592 | A1 | 8/2005 | Marwali et al. | |
| 2014/0292105 | A1 | 10/2014 | Hsieh | |

FOREIGN PATENT DOCUMENTS

| | | | |
|---|---|---|---|
| CN | 115642686 | | 1/2023 |
| CN | 115642686 | A | 1/2023 |
| EP | 2569841 | | 3/2013 |
| EP | 2569841 | B1 | 4/2021 |
| JP | 4643225 | | 3/2011 |
| JP | 4643225 | B2 | 3/2011 |
| WO | 2007075131 | | 7/2007 |
| WO | 2007075131 | A1 | 7/2007 |

* cited by examiner

*Primary Examiner* — Carlos Amaya
(74) *Attorney, Agent, or Firm* — Wolf, Greenfield & Sacks, P.C.

(57) ABSTRACT

A system for turning on thyristors is presented, the system comprising: an input configured to be coupled to a power source; an output configured to be coupled to a load; a first branch coupled between the input and the output and including a first thyristor having a first threshold voltage; a second branch coupled between the input and the output and coupled in parallel with the first branch, the second branch including a second thyristor having a second threshold voltage higher than the first threshold voltage; and at least one controller configured to control the system to selectively generate a biasing voltage across the second thyristor to induce a change in a voltage across the second thyristor from a first voltage to a second voltage, the first voltage being less than the second threshold voltage and the second voltage being greater than the second threshold voltage.

23 Claims, 11 Drawing Sheets

METHOD TO OPERATE PARALLEL BYPASS THYRISTORS AT LOW LOAD

CROSS-REFERENCE TO RELATED APPLICATIONS

This application claims priority under 35 U.S.C. § 120 as a continuation of U.S. application Ser. No. 18/211,683, titled "METHOD TO OPERATE PARALLEL BYPASS THYRISTORS AT LOW LOAD," filed on Jun. 20, 2023, which is hereby incorporated by reference in its entirety.

BACKGROUND

1. Field of the Disclosure

At least one example in accordance with the present disclosure relates generally to power systems having bistable switching elements, such as thyristors.

2. Discussion of Related Art

Power devices, such as uninterruptible power supplies (UPSs), may be used to provide regulated, uninterrupted power for sensitive and/or critical loads, such as computer systems and other data-processing systems. Existing UPSs include online UPSs, offline UPSs, line-interactive UPSs, as well as others. UPSs may provide output power to a load. The output power may be derived from a primary source of power, such as a utility-mains source, and/or derived from a back-up source of power, such as an energy-storage device.

SUMMARY

According to at least one aspect of the present disclosure, a system for turning on thyristors is presented, the system comprising: an input configured to be coupled to a power source; an output configured to be coupled to a load; a first branch coupled between the input and the output and including a first thyristor having a first threshold voltage; a second branch coupled between the input and the output and coupled in parallel with the first branch, the second branch including a second thyristor having a second threshold voltage higher than the first threshold voltage; and at least one controller configured to control the system to selectively generate a biasing voltage across the second thyristor to induce a change in a voltage across the second thyristor from a first voltage to a second voltage, the first voltage being less than the second threshold voltage and the second voltage being greater than the second threshold voltage.

In some examples, the biasing voltage is provided responsive to the system receiving an input voltage at the input. In various examples, the system further comprises a transformer coupled in series with the second thyristor. In many examples, in controlling the system to generate the biasing voltage, the at least one controller is further configured to control the transformer to induce a change in a voltage across the second thyristor from the first voltage to the second voltage. In some examples, the transformer includes a secondary winding, and wherein controlling the transformer includes controlling a voltage source to provide power to the secondary winding. In various examples, the system further comprises at least one busbar, wherein the transformer comprises a magnetic core surrounding the at least one busbar, the magnetic core being electromagnetically coupled to a primary winding and a secondary winding. In many examples, the change in the voltage across the second thyristor is equal to or greater than a sum of changes in voltages across one or more other thyristors coupled to one or more branches, each branch of the one or more branches being coupled in parallel with the second branch between the input and the output.

In some examples, the system further comprises a first current source coupled in a shunt configuration with respect to the first thyristor and a reference node; and a second current source coupled in a shunt configuration with respect to the second thyristor and the reference node. In various examples, the at least one controller is further configured to: control the first current source to output a first current having a first phase and magnitude; control the second current source to output a biasing current having a second phase and magnitude, wherein the biasing current is generated to cancel out the first current at the output. In many examples, the biasing current is generated to induce a change in a voltage across the second thyristor from the first voltage to the second voltage by an amount equal to the biasing voltage. In various examples, the first phase is 180 degrees out-of-phase with the second phase. In some examples, the input is configured to receive an input current from the power source, and wherein the at least one controller is further configured to: output a request to the power source to increase the input current provided at the input; control the first current source to provide a first current having a first phase and a first magnitude; and control the second current source to provide a biasing current having a second phase a second magnitude.

In many examples, the sum of the first magnitude and the second magnitude equals the amount of the increase of the input current provided at the input. In some examples, the first current source is a first inverter and the second current source is a second inverter. In various examples, the controller controls a current source to generate a biasing current to induce a voltage change equal to the biasing voltage across the second thyristor such that a new voltage across the second thyristor is greater than the second threshold voltage.

According to at least one aspect of the present disclosure, a method of operating a first thyristor and a second thyristor coupled in parallel is provided. The method comprises providing a voltage associated with a current to the first thyristor and the second thyristor; and providing a biasing voltage across the second thyristor to induce a change in a voltage across the second thyristor from a first voltage to a second voltage, the first voltage being less than a threshold voltage of the second thyristor and the second voltage being greater than the threshold voltage.

In some examples, providing the biasing voltage includes controlling a power source to provide a time-varying voltage to a secondary winding of a transformer coupled in series with the second thyristor. In various examples, providing the biasing voltage across the second thyristor includes operating a current source to provide a biasing current to the second thyristor. In many examples, the method further comprises providing a first current to a first node coupled between the first thyristor and the output; providing a biasing current to a second node coupled between the second thyristor and the output; and setting a first magnitude and phase of the first current and setting a second magnitude and phase of the biasing current such that the first current and the biasing current cancel each other out at the output.

In some examples, the method further comprises providing a first current to the first thyristor; directing a first portion of the first current to a reference node and through a first impedance associated with a first branch of a circuit that includes the first thyristor; and directing a second portion of the first current to the reference node and through a second impedance associated with a second branch of the circuit. In various examples, a sum of the first portion of the first current and the second portion of the first current is less than the first current.

According to at least one aspect of the present disclosure, a non-transitory computer-readable medium containing computer-readable instructions for a power system is presented. The instructions instruct at least one processor to control a first thyristor to draw an input current through the first thyristor; and responsive to controlling the first thyristor to draw the input current through the first thyristor, control a circuit element to provide a biasing voltage across a second thyristor to induce a change in a voltage across the second thyristor from a first voltage to a second voltage, the second voltage being greater than a threshold voltage of the second thyristor.

In various examples, the instructions further instruct the at least one processor to: control a power source to provide a time-varying voltage to a secondary winding of a transformer coupled in series with the second thyristor. In some examples, controlling the transformer to provide the biasing voltage across the second thyristor includes controlling a current source to provide a biasing current to a node coupled between the second thyristor and an output. In many examples, the instructions instruct the at least one processor to select a value of the biasing current provided to the node such that a corresponding voltage drop across the second thyristor is greater than the threshold voltage of the second thyristor. In various examples, the node is a second node and the instructions further instruct the at least one processor to: control a first current source to provide a first current to a first node, the first node coupled between the output and the first thyristor; and control a second current source to provide the biasing current to the second node. In some examples, the instructions further instruct the at least one processor to: control the first current source to provide the first current and the second current source to provide the biasing current such that the first current and the biasing current cancel each other at the output.

In various examples, the instructions further instruct the at least one processor to: control an input power source to increase an input current by an additional amount, and provide the input current increased by the additional amount to the first thyristor, wherein a sum of the first current and the biasing current equals the additional amount of the input current.

In some examples, an uninterruptible power supply for providing uninterrupted power to a load is provided. The uninterruptible power supply comprises an input configured to draw input power from a power source; an output configured to provide output power to the load; a thyristor having a threshold voltage and a first connection coupled to the input and a second connection coupled to the output; a biasing element coupled to the thyristor; and at least one controller configured to: select a biasing voltage to apply across the thyristor to increase a voltage across the thyristor from a first voltage to a second voltage, the biasing voltage being selected such that the second voltage is greater than the threshold voltage of the thyristor; and control, responsive to drawing the input power at the input, the biasing element to provide the biasing voltage across the thyristor.

In some examples, the biasing element is a current source coupled between the thyristor and a reference node. In various examples, the at least one controller is further configured to control the current source to generate a current from the second connection to the reference node. In many examples, the biasing element is coupled to the first connection of the thyristor; and the biasing element is a transformer having a primary winding and a secondary winding. In various examples, the at least one controller is further configured to control a transformer power source to provide a time-varying voltage to the secondary winding of the transformer.

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION

Figure 1:
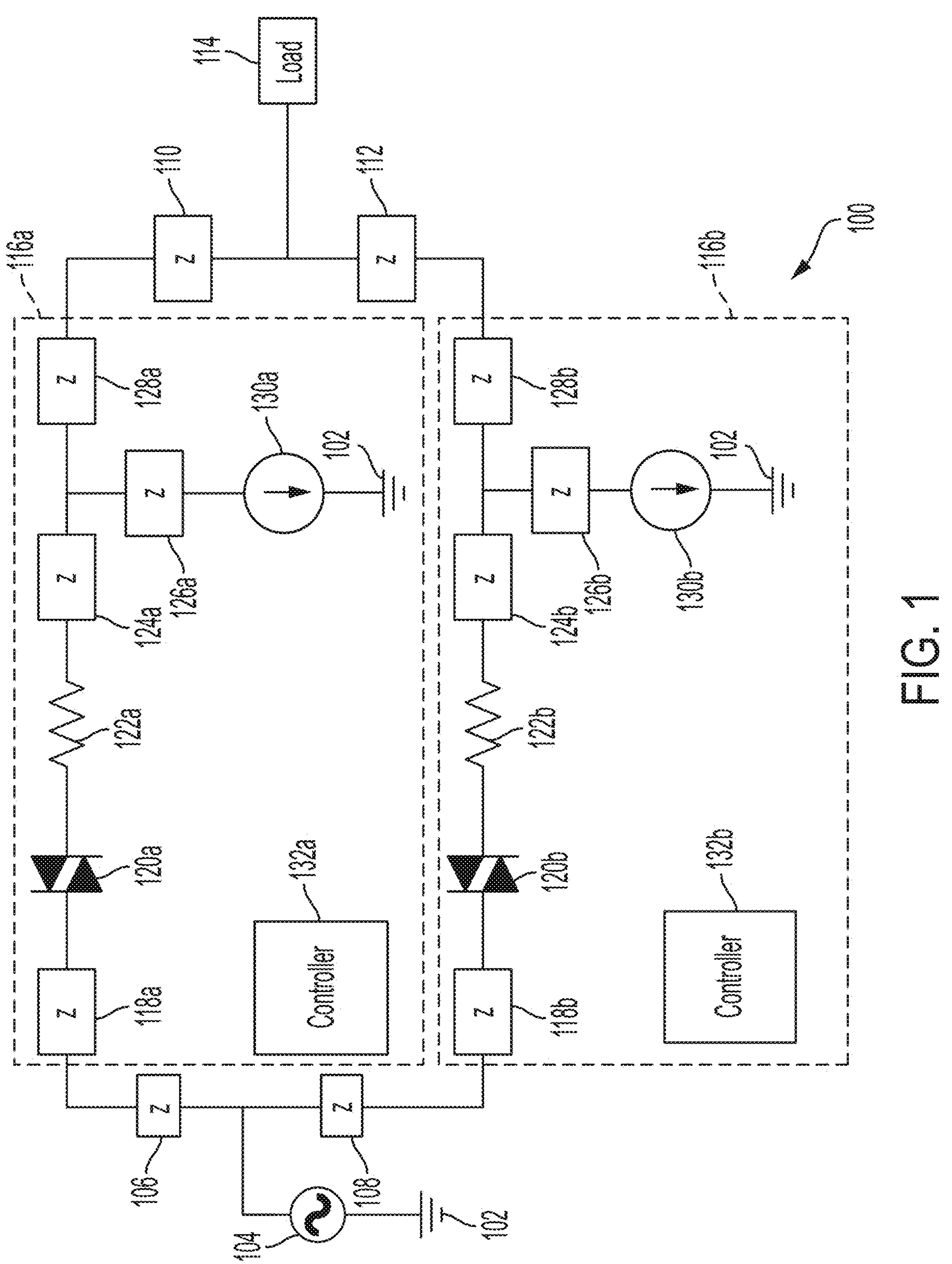
FIG. 1 illustrates a schematic diagram of a power system according to an example.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items.

References to "or" may be construed as inclusive so that any terms described using "or" may indicate any of a single, more than one, and all of the described terms. In addition, in the event of inconsistent usages of terms between this document and documents incorporated herein by reference, the term usage in the incorporated features is supplementary to that of this document; for irreconcilable differences, the term usage in this document controls.

In some parallel power systems, silicon-controlled rectifiers (SCRs), thyristors, and/or other types of bistable switches (collectively "thyristors") may turn on at different times due to differences in the thyristors. For example, the thyristors may have different threshold voltages. A threshold voltage of a thyristor may refer to a minimum forward voltage (for example, a voltage from the anode to the cathode of the thyristor) that is applied to the thyristor before the thyristor begins conducting an appreciable forward current. Once turned on (that is, once the thyristor begins conducting an appreciable amount of current), the thyristor may remain on provided the forward voltage remains above a minimum voltage value corresponding to a voltage where the thyristor would turn off. In some examples, the term conducting voltage may refer to the forward voltage across the thyristor while the thyristor is conducting an appreciable amount of current. In some examples, the conducting voltage may be lower than and/or may drop below the threshold voltage. That is, in some examples, the thyristor may continue conducting an appreciable amount of current even if the conducting voltage is less than the threshold voltage. Similarly, thyristors may have different breakdown voltages. A breakdown voltage of a thyristor may refer to a minimum reverse voltage (that is, a voltage from the cathode to the anode of the thyristor) that is applied to the thyristor before the thyristor breaks down and conducts a reverse current.

As an example, a first thyristor connected in parallel with a second thyristor between an input and an output may turn on (that is, begin to conduct a non-negligible amount of current) before the second thyristor if the threshold voltage of the first thyristor is lower than the threshold voltage of the second thyristor.

Furthermore, in some power systems that use parallel thyristors, a lag can arise between a power source providing an input voltage and every parallel thyristor turning on. This lag can cause disturbances and/or irregularities in the power provided by the power system. For example, a power system may include two or more power devices, such as uninterruptible power supplies (UPSs), connected in parallel. Each parallel-connected UPS may include a respective thyristor, which may be referred to herein as "parallel thyristors."

Parallel thyristors, such as respective thyristors in parallel-connected UPSs, may be turned on simultaneously or with less lag by providing a biasing voltage and/or current to at least one thyristor via a biasing element. The biasing voltage and/or current may cause a forward voltage across a respective thyristor to exceed the threshold voltage of the thyristor by a sufficient amount to ensure the thyristor conducts in the desired direction. The biasing element may include a circuit element capable of altering a voltage drop across the thyristor or a branch of the circuit containing the thyristor, such as a current or voltage source.

The present disclosure provides systems and methods that enable parallel thyristors to turn on simultaneously and/or closer to simultaneously compared to existing systems and methods. Some examples of the systems and methods use current sources as biasing elements to generate biasing voltages that increase the voltage across the thyristors. Some of the systems and methods use transformers as biasing elements to generate biasing voltages across the thyristors. By generating a biasing voltage across the thyristors, the systems can ensure that the breakdown and/or threshold voltages of the thyristors are exceeded when desired, thus causing the thyristors to conduct (that is, turn on).

FIG. 1 illustrates a schematic diagram of a power system 100 according to an example. The power system 100 facilitates the simultaneous or near-simultaneous turn-on of a first thyristor 120*a* and a second thyristor 120*b*. In some examples, the power system 100 may use one or more current sources to induce currents and/or voltages in the power system 100 such that the voltage across the thyristors 120*a*, 120*b* exceeds the threshold voltages of both of the thyristors 120*a*, 120*b* for at least an interval of time.

The power system 100 includes a reference node 102, an input power source 104 ("power source 104"), a first impedance 106, a second impedance 108, a third impedance 110, a fourth impedance 112, one or more loads 114 ("load 114"), and at least two power devices including a first power device 116*a* ("first device 116*a*") and a second power device 116*b* ("second device 116*b*"). In at least one example, each of the devices 116*a*, 116*b* may be or include at least a portion of a UPS. The first impedance 106, the first device 116*a*, and the third impedance 110 may be collectively referred to as a "first branch" of the power system 100. The second impedance 108, the second device 116*b*, and the fourth impedance 112 may be collectively referred to as a "second branch" of the power system 100. The first and second branches may be connected in parallel with one another.

The first device 116*a* includes a first input impedance 118*a*, a first thyristor 120*a*, a first resistance 122*a*, a first line impedance 124*a*, a first source impedance 126*a*, a first output impedance 128*a*, a first current source 130*a*, and at least one first controller 132*a* ("first controller 132*a*"). The second device 116*b* includes a second input impedance 118*b*, a second thyristor 120*b*, a second resistance 122*b*, a second line impedance 124*b*, a second source impedance 126*b*, a second output impedance 128*b*, a second current source 130*b*, and at least one second controller 132*b* ("second controller 132*b*").

The power source 104 is coupled to the reference node 102 at a first connection and to the first and second impedances 106, 108 at a second connection. The first impedance 106 is coupled to the power source 104 at a first connection and to the first device 116*a* at a second connection. In some examples, the first impedance 106 is coupled to the first input impedance 118*a* at the second connection. The second impedance 108 is coupled to the power source 104 at a first connection and to the second device 116*b* at a second connection. In some examples, the second impedance 108 is coupled to the second input impedance 118*b* at the second connection. The third impedance 110 is coupled to the load 114 at a first connection and to the first device 116*a* at a second connection. In some examples, the third impedance 110 is coupled to the first output impedance 128*a* at the second connection. The fourth impedance 112 is coupled to the load 114 at a first connection and to the second device 116*b* at a second connection. In some examples, the fourth impedance 112 is coupled to the second output impedance 128*b* at the second connection. The load 114 is coupled to the third impedance 110 and fourth impedance 112.

The first input impedance 118*a* is coupled at a first connection to an input of the first device 116*a* and is coupled to the first thyristor 120*a* at a second connection. The first thyristor 120*a* is coupled to the first input impedance 118*a* at a first connection and to the first resistance 122*a* at a second connection. The first resistance 122*a* is coupled to the first thyristor 120*a* at a first connection and to the first line impedance 124*a* at a second connection. The first line impedance 124*a* is coupled to the first resistance 122*a* at a first connection and to the first source impedance 126*a* and the first output impedance 128*a* at a second connection. The first source impedance 126*a* is coupled to the first current source 130*a* at a first connection, and to the first line impedance 124*a* and the first output impedance 128*a* at a second connection. The first current source 130*a* is coupled to the first source impedance 126*a* at a first connection and to the reference node 102 at a second connection. Because the first current source 130*a* is coupled to the reference node 102, the first current source 130*a* can be said to be coupled in a shunt configuration with respect to the series configuration of the first input impedance 118*a*, the first thyristor 120*a*, the first resistance 122*a*, the first line impedance 124*a*, and the first output impedance 128*a*.

The second input impedance 118*b* is coupled at a first connection to an input of the second device 116*b* and is coupled to the second thyristor 120*b* at a second connection. The second thyristor 120*b* is coupled to the second input impedance 118*b* at a first connection and to the second resistance 122*b* at a second connection. The second resistance 122*b* is coupled to the second thyristor 120*b* at a first connection and to the second line impedance 124*b* at a second connection. The second line impedance 124*b* is coupled to the second resistance 122*b* at a first connection and to the second source impedance 126*b* and the second output impedance 128*b* at a second connection. The second source impedance 126*b* is coupled to the second current source 130*b* at a first connection, and to the second line impedance 124*b* and the second output impedance 128*b* at a second connection. The second current source 130*b* is coupled to the second source impedance 126*b* at a first connection and to the reference node 102 at a second connection. Because the second current source 130*b* is coupled to the reference node 102, the second current source 130*b* can be said to be coupled in a shunt configuration with respect to the series configuration of the second input impedance 118*b*, the second thyristor 120*b*, the second resistance 122*ba*, the second line impedance 124*b*, and the second output impedance 128*b*.

A node connecting the third impedance 110, the fourth impedance 112, and the load 114 may be referred to as "node A." A node connecting the power source 104, the first impedance 106, and the second impedance 108 may be referred to as a "node B." A node connecting the first line impedance 124*a*, the first source impedance 126*a*, and the first output impedance 128*a* may be referred to as a "node C." A node connecting the second line impedance 124*b*, the second source impedance 126*b*, and the second output impedance 128*b* may be referred to as a "node D."

The respective impedances and thyristors of the first device 116*a* and the second device 116*b* are not necessarily identical. Differences may arise due to, for example, variances introduced by manufacturing. For example, the threshold voltages of the first thyristor 120*a* and second thyristor 120*b* are not necessarily identical, even if—in some examples—the components are chosen to match as closely as possible during manufacture. In some examples, the threshold voltage of the first thyristor 120*a* may be greater than the threshold voltage of the second thyristor 120*b*.

The first impedance 106 may be a line impedance of the connection between the power source 104 and the first device 116*a*. The second impedance 108 may be a line impedance of the connection between the power source 104 and the second device 116*b*. The third impedance 110 may be a line impedance of the connection between the first device 116*a* and the load 114. The fourth impedance 112 may be a line impedance of the connection between the second device 116*b* and the load 114. A line impedance may be an impedance attributable to the conductors connecting the power devices 116*a*, 116*b* to the load 114 and/or power source 104.

With respect to the first device 116*a*, the first input impedance 118*a* may be an impedance of an internal busbar or similar conductor. The first resistance 122*a* may be a resistance of the first thyristor 120*a*. In some examples, the first resistance 122*a* may have both resistive and reactive components (that is, the first resistance 122*a* may be an impedance). The first line impedance 124*a* may be an impedance of an internal busbar or similar conductor. The first source impedance 126*a* may be an impedance of the first current source 130*a* and/or internal cables or other conductors connecting the first current source 130*a* to the first line impedance 124*a* and/or to the first output impedance 128*a*. The first output impedance 128*a* may be an impedance of internal busbars or similar conductors.

With respect to the second device 116*b*, the second input impedance 118*b* may be an impedance of an internal busbar or similar conductor. The second resistance 122*b* may be a resistance of the second thyristor 120*b*. In some examples, the second resistance 122*b* may have both resistive and reactive components (that is, the second resistance 122*b* may be an impedance). The second line impedance 124*b* may be an impedance of an internal busbar or similar conductor. The second source impedance 126*b* may be an impedance of the second current source 130*b* and/or internal cables or other conductors connecting the second current source 130*b* to the second line impedance 124*b* and/or to the second output impedance 128*b*. The second output impedance 128*b* may be an impedance of internal busbars or similar conductors.

With respect to the first device 116*a*, the first current source 130*a* may be an inverter or converter (for example, a DC/DC converter, an AC/DC converter, or a DC/AC inverter controlled by the first controller 132*a* to operate as a current source). The first current source 130*a* may be unidirectional or bidirectional. The first current source 130*a* may provide a current to the reference node 102 or to the first source impedance 126*a*. The first current source 130*a* may provide constant or variable currents, and may provide the current as a DC or AC current.

With respect to the second device 116*b*, the second current source 130*b* may be an inverter or converter (for example, a DC/DC converter, an AC/DC converter, or a DC/AC inverter controlled by the second controller 132*b* to operate as a current source). The second current source 130*b* may be unidirectional or bidirectional. The second current source 130*b* may provide a current to the reference node 102 or to the second source impedance 126*b*. The second current source 130*b* may provide constant or variable currents, and may provide the current as a DC or AC current.

With respect to the first device 116*a*, the first thyristor 120*a* may act as a switch allowing a current to pass through the first thyristor 120*a* in either direction. The first thyristor 120*a* may have a threshold voltage and a breakdown voltage. In some examples, the threshold voltage may include the voltage needed to be overcome to allow a non-negligible current to pass through the first thyristor 120*a* from the power source 104 to the first output impedance 128*a*. In some examples, a second threshold voltage may include the voltage needed to be overcome to allow a non-negligible current to pass through the first thyristor 120*a* from the load 114 to the first input impedance 118*a*.

With respect to the second device 116*b*, the second thyristor 120*b* may act as a switch allowing a current to pass through the second thyristor 120*b* in either direction. The second thyristor 120*b* may have a threshold voltage and a breakdown voltage. In some examples, the threshold voltage may include the voltage needed to be overcome to allow a current to pass from the power source 104 to the second output impedance 128*b* through the second thyristor 120*b*, and the second threshold voltage may include the voltage needed to be overcome to allow a current to pass from the load 114 to the second input impedance 118*b* through the second thyristor 120*b*.

The power source 104 may be any power source, including a power source capable of providing AC or DC power. For example, the power source 104 may be an AC mains utility grid. The load 114 may be any load rated to receive power from the power devices 116*a*, 116*b*.

The first controller 132*a* may be configured to control operation of at least the first current source 130*a*, as well as to provide communication and interface functionality to the first device 116*a*. The first controller 132*a* may be configured to determine a current provided by the power source 104 to the load 114, and may be configured to communicate with other controllers (for example, the second controller 132*b*).

The second controller 132*b* may be configured to control operation of at least the second current source 130*b*, as well as to provide communication and interface functionality to the second device 116*b*. The second controller 132*b* may be configured to determine a current provided by the power source 104 to the load 114, and may be configured to communicate with other controllers (for example, the first controller 132*a*).

The current sources 130*a*, 130*b* may be configured to output a current. For example, the current sources 130*a*, 130*b* may include inverters. The controllers 132*a*, 132*b* may control the current sources 130*a*, 130*b* to bias the thyristors 120*a*, 120*b* in some examples, as discussed in greater detail below. In other examples, power devices may include alternative sources to bias the thyristors 120*a*, 120*b* in addition to, or in lieu of, the current sources 130*a*, 130*b*. For example, power devices may include transformers with associated control circuits to deliver a controllable bias voltage and/or current to the thyristors 120*a*, 120*b*.

Figure 2:
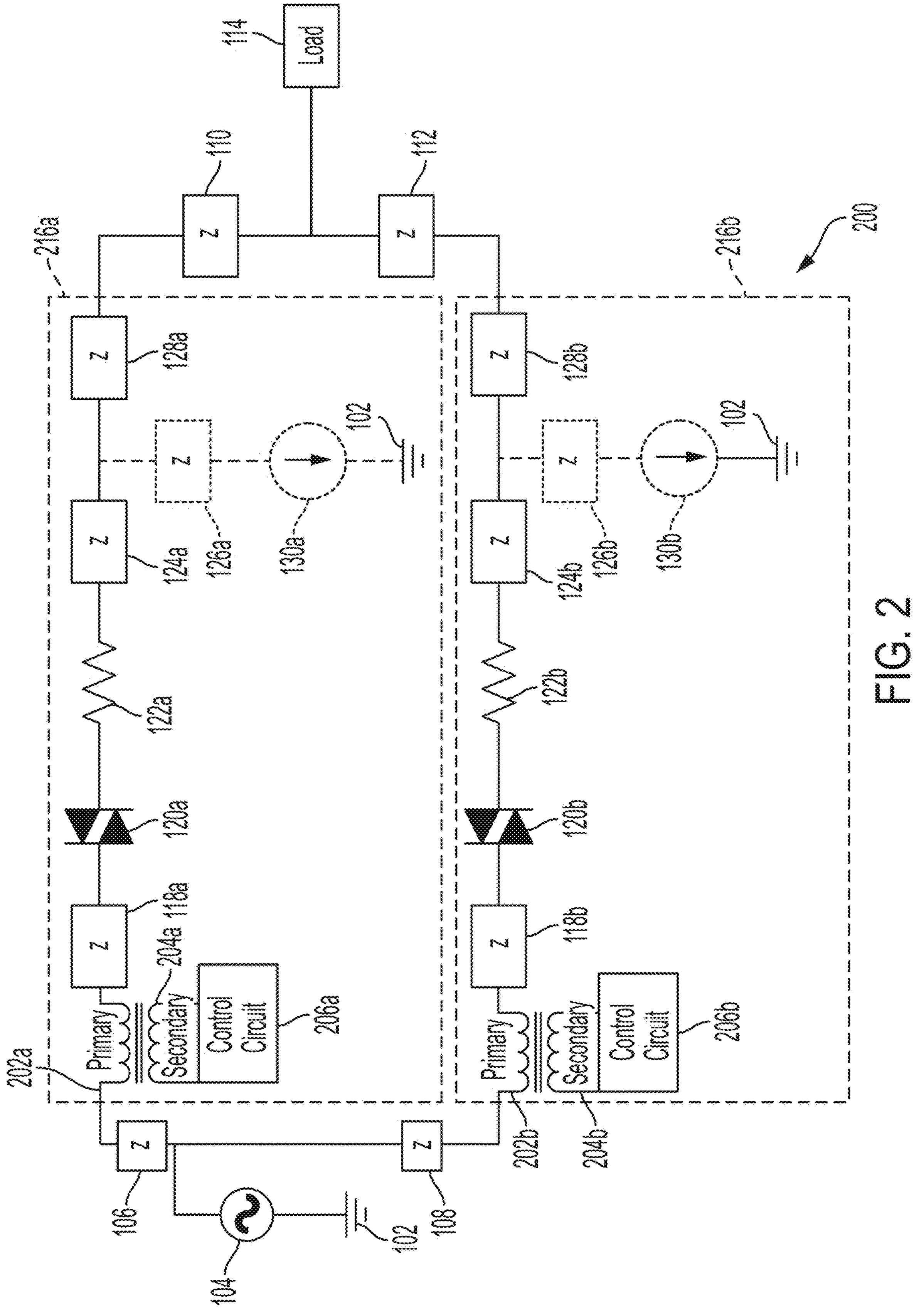
FIG. 2 illustrates a schematic diagram of a power system according to an example.

FIG. 2 illustrates a schematic diagram of a power system 200 according to an example in which transformers and control circuits are implemented. The power system 200 has an alternate topology compared to the topology of the power system 100 of FIG. 1, and will be discussed in greater detail below.

Figure 3:
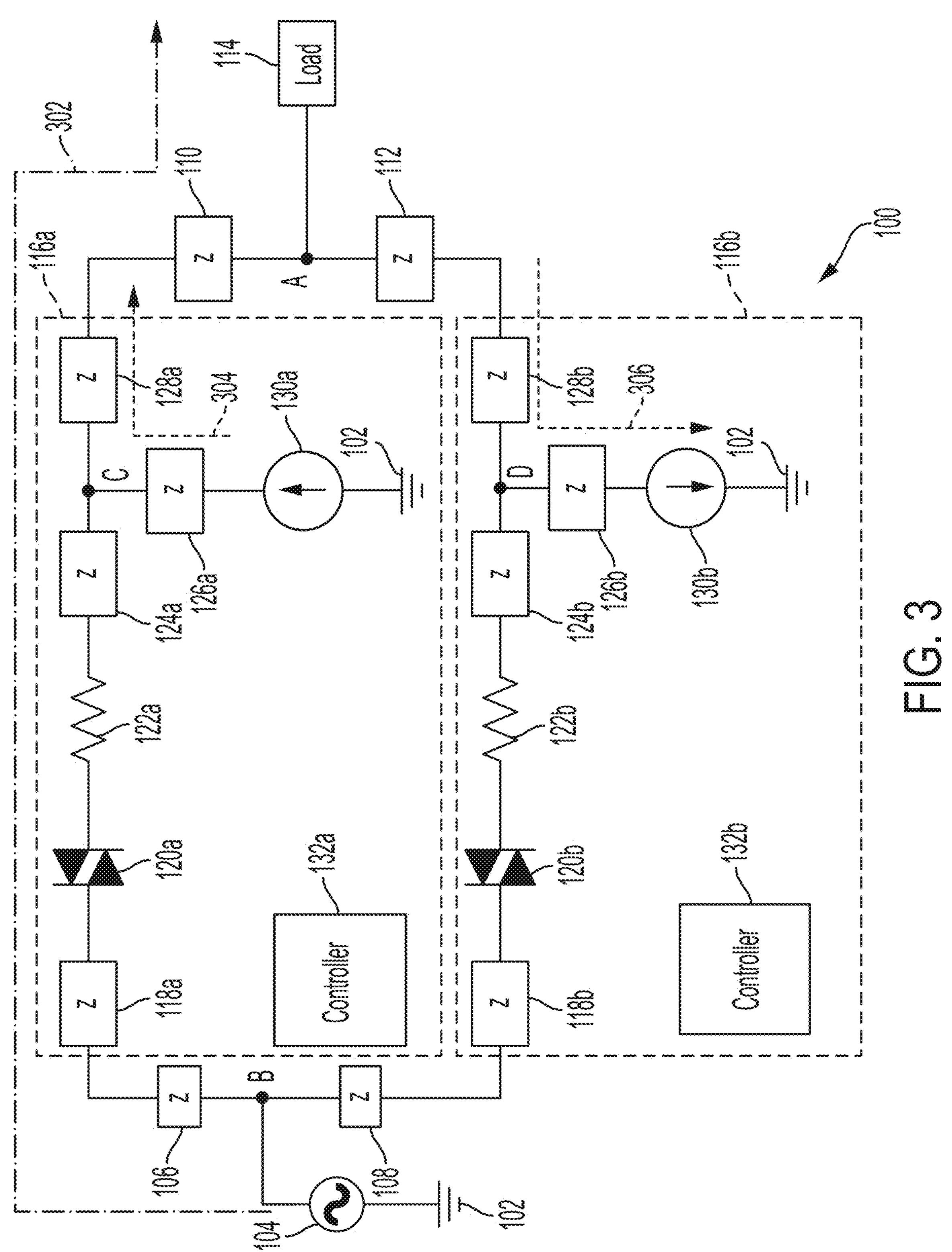
FIG. 3 illustrates a schematic diagram of a power system according to an example.

FIG. 3 illustrates a schematic diagram of the power system 100 of FIG. 1 in a first mode of operation according to an example. FIG. 3 includes a first trace 302, a second trace 304, and a third trace 306. The first trace 302 indicates a current provided by the power source 104 to the load 114 via the first device 116*a*. The second trace 304 indicates a current provided by the first current source 130*a* to the node A. The third trace 306 indicates a current drawn by the second current source 130*b* from the node A.

In the first mode of operation, the power source 104 provides power to both the first device 116*a* and the second device 116*b*. For purposes of example, the first thyristor 120*a* has a lower conducting voltage and/or threshold voltage compared to the threshold voltage of the second thyristor 120*b*. In this example, the first thyristor 120*a* is conducting the current indicated by the first trace 302. Thus, the first trace 302 shows the current originating from the power source 104 and passing through the first thyristor 120*a* to the load 114. In this example, the voltage across the second thyristor 120*b* is less than the threshold voltage of the second thyristor 120*b*; accordingly, the second thyristor 120*b* does not conduct appreciable current (that is, does not turn on).

If only the current and power corresponding to the first trace 302 is provided to the power system 100, the second thyristor 120*b* may turn on after the first thyristor 120*a* or may not turn on at all because the voltage drop across the second thyristor 120*b* may never exceed the threshold voltage of the second thyristor 120*b*. To ensure that the thyristors 120*a*, 120*b* turn on at approximately the same time, the first controller 132*a* and/or the second controller 132*b* may control the first current source 130*a* and the second current source 130*b* to generate a current originating at the first current source 130*a* of the first device 116*a* and being provided to the reference node 102 through the second current source 130*b*. In some examples, one or more of the controllers 132*a*, 132*b* may control the first current source 130*a* to produce a first current pulse having a first phase angle and the second current source 130*b* to produce a second current pulse having a second phase angle. In some examples, the second phase angle may be 180 degrees different than the first phase angle. In some examples, at least the magnitudes of the first pulse and second pulse may be equal. The first and second pulses may contribute to the creation of a current from the first current source 130*a* through the second current source 130*b* and to the reference node 102.

The current created by the pulses may be "invisible" with respect to the load 114. That is, since the first pulse is equal and opposite to the second pulse, no portion of the current created by the pulses may be provided to the load 114. For example, the current entering node A must equal the current exiting node A. The current entering node A via the third impedance 110 is equal to the sum of the current indicated by the first trace 302 and the current indicated by the second trace 304. The current exiting node A via the fourth impedance 112 is equal to the current indicated by the third trace 306.

Because the current of the third trace 306 is equal in magnitude and 180 degrees out of phase compared to the current indicated by the second trace 304, the currents indicated by the second and third traces 304, 306 are equal but have opposite directions (that is, the current indicated by the second trace 304 enters node A while the current indicated by the third trace 306 exits node A). As a result, the current provided to the load 114 is equal to the current of the first trace 302, and the effects of the currents indicated by the second trace 304 and third trace 306 are not seen by the load 114.

The current indicated by the second and third traces 304, 306 contributes to a change in voltage drop across the second thyristor 120*b*. Because the second current source 130*b* is providing a current that passes from the second source impedance 126*b* to the reference node 102, in at least some examples the voltage at the node D may drop when the current indicated by the third trace 306 is applied. A drop in the voltage at node D may correspond to a change in the voltage drop across the second thyristor 120*b*. In particular, the voltage drop across the second thyristor 120*b* may increase to a value greater than the threshold voltage of the second thyristor 120*b*, thus causing the second thyristor 120*b* to conduct.

In some examples, the following equations may indicate the relationship of voltages in the power system 100 when the second thyristor 120*b* is not conducting based on the foregoing example:

$$V_1 = V_{th} + I_1 \cdot (Z_{c1} + R_{a1} + Z_{a1} + Z_{a2}) \quad (1)$$

$$V_2 = (I_1 + I_2) \cdot (Z_{a3} + Z_{c3}) \quad (2)$$

$$V_3 = -I_2 \cdot (Z_{c4} + Z_{b3}) \quad (3)$$

$$V_4 = V_1 + V_2 - V_3 \quad (4)$$

where $V_1$ is the voltage across nodes B and C, $V_2$ is the voltage drop across nodes C and A, $V_3$ is the voltage drop across nodes A and D, and $V_4$ is the voltage drop across nodes B and D (which may be equal to a voltage drop across the second thyristor 120*b* where the second thyristor 120*b* is not conducting). $I_1$ is the current represented by the first trace 302, and $I_2$ is the current represented by the second and third traces 304, 306. $V_{th}$ is the voltage drop across the first thyristor 120*a*. $Z_{c1}$ is the impedance of the first impedance 106. $R_{a1}$ is the resistance of the first resistance 122*a*. $Z_{a1}$ is the impedance of the first input impedance 118*a*. $Z_{a2}$ is the impedance of the first line impedance 124*a*. $Z_{a3}$ is the impedance of the first output impedance 128*a*. $Z_{c3}$ is the impedance of the third impedance 110. $Z_{c4}$ is the impedance of the fourth impedance 112. $Z_{b3}$ is the impedance of the second output impedance 128*b*.

In some examples, at least one of the controllers 132*a*, 132*b* may control the first current source 130*a* to provide a "positive" first pulse at a first time and the second current source 130*b* to provide a "negative" first pulse at the first time. The "positive" first pulse may have a magnitude equal to that of the "negative" first pulse. At a second time, the controllers 132*a*, 132*b* may control the first current source 130*a* to provide a "negative" second pulse and the second current source 130*b* to provide a "positive" second pulse. The terms "positive" and "negative" may represent a direction of current with respect to a circuit node, such as the node A. "Positive" may connote current passing into the node A, and "negative" may connote current passing out of the node A, or vice versa.

In some examples, the controllers 132*a*, 132*b* control the current sources 130*a*, 130*b* to provide these pulses at sequential zero crossings of the voltage of the input power provided by the power source 104. In this way, the controllers 132*a*, 132*b* can control the current sources 130*a*, 130*b* to create equal but opposite oscillating pulses of current to generate an AC current from the first current source 130*a* to the second current source 130*b*.

As discussed above, in some examples, the power devices 116*a*, 116*b* may illustrate at least portions of respective UPSs coupled in parallel. Although two power devices 116*a*, 116*b* are illustrated, the principles of the disclosure are applicable to power systems having more than two parallel-connected power devices, which may be parallel-connected UPSs.

Figure 4:
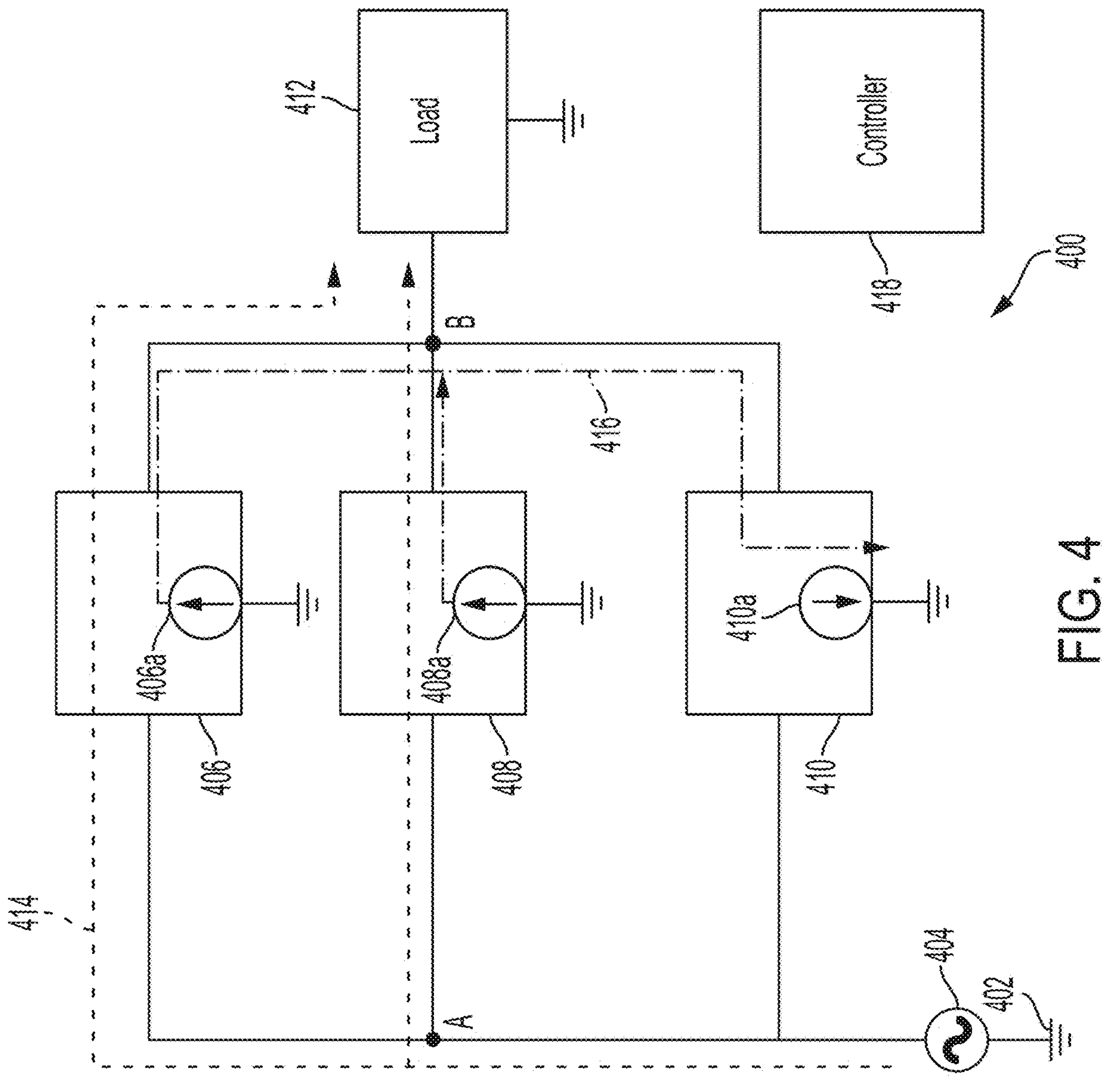
FIG. 4 illustrates a schematic diagram of a power system according to an example.

For example, FIG. 4 illustrates a block diagram of a power system 400 having more than two power devices (which may, in some examples, be UPSs) connected in parallel between a power source and a load according to an example. The power system 400 includes a reference node 402, a power source 404, a first power device 406 ("first device 406"), a second power device 408 ("second device 408"), a third power device 410 ("third device 410"), a load 412, and at least one controller 418 ("controller 418"). Each of the power devices 406-410 may also include a current source. The first device 406 may include a first current source 406*a*. The second device 408 may include a second current source 408*a*. The third device 410 may include a third current source 410*a*. FIG. 4 also includes a first trace 414 indicating a path of a first current and a second trace 416 indicating a path of a second current. The power devices 406-410 may be similar or identical to the power devices 116*a*, 116*b* of FIGS. 1 and 3. FIG. 4 also illustrates two nodes, including a node A (representing a node between the power source 404 and the devices 406-410) and a node B (representing a node between the devices 406-410 and the load 412).

In the power system 400, the power source 404 is coupled at a first connection to the reference node 402, and at a second connection to each of the power devices 406-410. The first device 406 is coupled to the power source 404 at a first connection, to the load 412 at a second connection, and to the reference node 404 at a third connection. The second device 408 is coupled to the power source 404 at a first connection, to the load 412 at a second connection, and to the reference node 402 at a third connection. The third device 410 is coupled to the power source 404 at a first connection, to the load 412 at a second connection, and to the reference node 402 at a third connection.

The first trace 414 indicates the path of a first current provided by the power source 404. The current provided by the power source 404 enters node A, passes through the first and second devices 406, 408 to node B, and then is provided to the load 412. In this example, the third device 410 may include a non-conductive thyristor; accordingly, no appreciable portion of the first current passes through the third device 410. The first current splits when passing from node A to the node B. In particular, a portion of the first current passes through the first device 406 and a portion of the first current passes through the second device 408.

The second trace 416 depicts the path of a second current provided by the current sources 406*a*, 408*a*, 410*a* of the devices 406-410. The second current corresponding to the second trace 416 is provided by the current sources 406*a*, 408*a* of the first and second devices 406, 408 to the third device 410 via the node B. The second current proceeds from node B through the current source of the third device 410 to the reference node 402. The second current is split as portions thereof are provided to node B by the first device 406 and the second device 408. At node B, the second current is combined into a single current that passes through the third device 410 to the reference node 402.

The third current source 110*a* may provide a current equal but opposite the sum of the currents provided by the first device 406 and the second device 408, since otherwise the second current may be seen by the load 412. In some examples, when an odd number of power devices is present, at least one power device may provide a current equal and opposite in direction to the sum of the currents provided by two (or more) other power devices. In some examples, when an even number of power devices is present, each power device can provide a current of equal magnitude. Half of the power devices may provide current in one direction and the other half of the power devices may provide current in another direction. In some examples, a single power device may provide a pulse having an equal magnitude and opposite polarity of more than two other power devices, provided that the net current is zero from the perspective of the load 412.

In some examples, at least one controller may control one or more power devices to produce a first pulse having a first polarity while also controlling one or more other power devices to produce a simultaneous pulse having an opposite polarity. The at least one controller may include the controller 418, which may be a part of any, some, or all of the power devices 406-410 or which may be independent of the power devices 406-410. After the first pulse is provided, the controller 418 may control, possibly after a short delay, the one or more power devices to produce a second pulse having a polarity opposite that of the first pulse, and may control the one or more other power devices to produce a simultaneous pulse having the polarity of the first pulse (that is, a polarity opposite the polarity of the second pulse). The power devices selected to produce the first and second pulses may be chosen at random. The power devices selected to produce the simultaneous pulses may also be chosen at random or may be the set of power devices not selected to produce the first and second pulses. In other examples, the power devices generating the pulses may be selected based on which devices are or are not conducting.

Figure 5A:
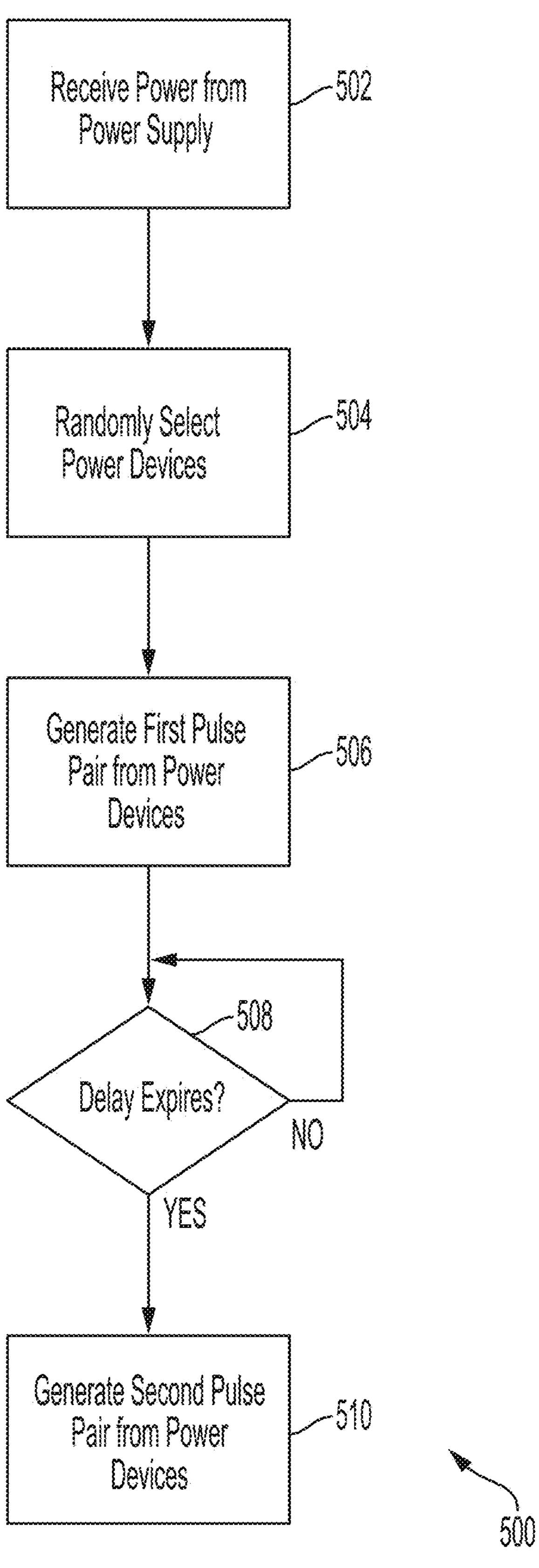
FIG. 5A illustrates a process for turning on a thyristor according to an example.
Figure 5B:
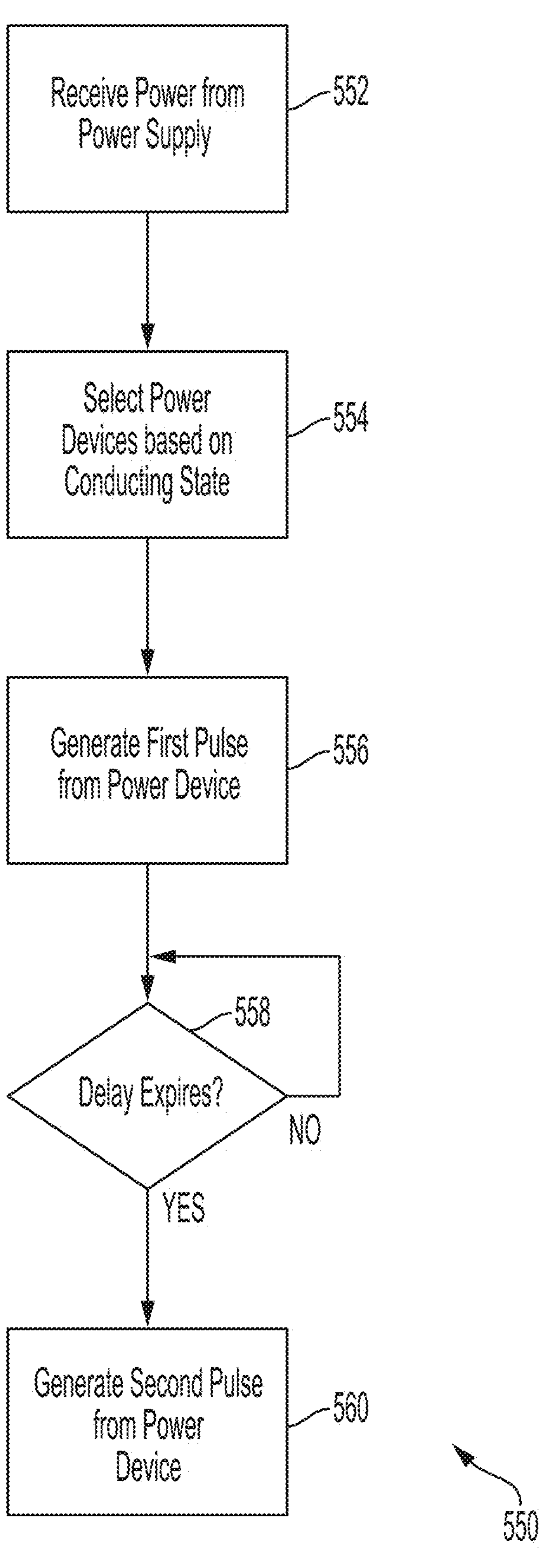
FIG. 5B illustrates a process for turning on a thyristor according to an example.

FIGS. 5A and 5B illustrate processes 500, 550 for ensuring two or more thyristors connected in parallel between a power source and load turn on according to respective examples.

For the process 500 of FIG. 5A, in at least one example a controller (for example, the controller 418) selects two or more power devices (for example, the power devices 406-410) at random, and creates a first group and a second group based on the selected power devices. At a given time, for example a zero crossing of a voltage or current of input power, the controller 418 controls the first group to generate a pair of pulses comprising a first pulse of a first polarity and a second pulse of an inverse polarity. The first pulse may be generated at a first time (for example, at the aforementioned zero crossing), and the second pulse may be generated immediately after the first pulse (for example, very shortly after the aforementioned zero crossing). At the same time, the controller 418 controls the second group to generate a pair of pulses where the first pulse (which may be generated at the first time) is the inverse polarity and the second pulse (which may be generated immediately after the first pulse) is the first polarity. At the next zero crossing, the controller 418 may control the first group to generate a second pair of pulses, this time of the inverse polarity followed by the first polarity, while the second group is controlled to generate a second pair of pulses, this time of the first polarity followed by the inverse polarity.

By contrast, in the process 550, the controller 550 may select two or more power devices 406-410 and separate the devices into a first group and a second group. The first group may include one or more member power devices from among the power devices 406-410 having conducting thyristors and the second group may include one or more member power devices from among the power devices 406-410 having non-conducting thyristors. At a given time, for example a zero crossing of the voltage or current of the input power, the controller 418 may control the first group to generate a single pulse of a first polarity and the second group to generate a single pulse of an inverse polarity. At a subsequent time (for example, the next zero crossing) the controller 418 may control the first group to generate a single pulse of the inverse polarity and the second group to generate single pulse of the first polarity. Thus, in at least some examples, process 500 is characterized by generating pairs of pulses at given times for each power device of the power devices 406-410 selected, and process 550 is characterized by generated a single pulse at given times for each power device of the power devices 406-410 selected.

FIG. 5A illustrates a process 500 for ensuring two or more thyristors connected in parallel between a power source and a load turn on according to an example. The process 500 is described with respect to the components of FIG. 4, however, the process 500 may also apply to the components of FIG. 1 or to other examples. For example, whereas in some examples acts of the process 500 may be executed by the controller 418, in other examples the process 500 may be executed by one or both of the controllers 132*a*, 132*b*.

At act 502, the controller 418 receives a signal or other indication that the power source 404 is providing power to two or more of the power devices 406-410 connected in parallel between the power source 404 and the load 412. The signal may be transmitted from the power source 404 or may be received from a sensor or other device configured to detect whether the power source 404 is supplying power to the power devices 406-410 and/or the load 412. The process 500 may continue to act 504.

At act 504, the controller 418 selects at random two or more power devices from among the power devices 406-410. The controller 418 may use any random or pseudorandom algorithm to select the power devices. The controller 418 may select an odd or even number of power devices 406-410. The controller 418 may assign a first group of the selected power devices 406-410 to generate a first pair of pulses of current, and a second group of the selected power devices 406-410 to generate a second pair of pulses of current. The process 500 may then continue to act 506.

At act 506, the controller 418 controls and/or instructs the first group to generate a first pair of pulses of current. The controller 418 may control and/or instruct at least one current source, such as an inverter or converter, to generate the first pair of pulses of current. In some examples, the at least one current source may include one or more respective current sources 406*a*, 408*a*, 410*a* of each power device 406-410. The controller 418 may instruct the power devices of the first group to each generate a "positive" pulse of current followed immediately by a "negative" pulse of current. The sum of the positive pulses of current generated in this way may be called the first positive current and the sum of negative pulses generated in this way may be called the first negative current. The controller 418 may instruct the second group to generate a "negative" pulse of current followed immediately by a "positive" pulse of current. The sum of the negative pulses of current generated in this way may be called the second negative current and the sum of positive pulses generated in this way may be called the second positive current.

In some examples, the controller 418 may determine the amount of current each power device 406-410 generates such that the sum of the first positive current and first negative current is zero from the point of view of the load 412 and/or the sum of the first negative current and second positive current is zero from the point of view of the load 412. The process 500 may then continue to act 508.

At act 508, the controller 418 determines whether a delay period of time after generating the first pulse of current has elapsed. The amount of time may vary depending on characteristics such as the frequency of the power system. The delay may be determined with respect to a phase angle relative to the first pulse of current. In some examples, the delay may be provided to prevent the pulse from generating until shortly or immediately after a zero-crossing. In some examples, the delay be zero, that is, omitted. If the controller 418 determines the delay has not expired (508 NO), the controller 418 may wait. If the controller 418 determines the delay has expired (508 YES), the process 500 may continue to act 510.

At act 510, the controller 418 controls and/or instructs the selected power devices 406-410 to generate a second pair of pulses of current. The controller 418 may control and/or instruct at least one current source, such as an inverter or converter, to generate the pair of second pulses. The controller 418 may control the first group, which previously generated a positive pulse followed by a negative pulse to now generate a negative pulse followed by a positive pulse. The controller 418 may instruct the second group, which previously generated a negative pulse followed by a positive pulse, to generate a positive pulse followed by a negative pulse. As before, the sum total of the currents generated by the first group and second group may be zero from at least the point of view of the load 412. In some examples, the selected power devices 406-410 may generate pulses of equal magnitude but opposite directions compared to the pulses generated during act 506.

FIG. 5B illustrates a process 550 for ensuring two or more thyristors in two or more respective power devices connected in parallel between a power source and a load turn on according to an example. In contrast to the process 500 of FIG. 5A, the process 550 of FIG. 5B does not select power devices at random. The process 550 is described with respect to the components of FIG. 4, however, the process 550 may also apply to the components of FIG. 1 or to other examples. For example, whereas in some examples acts of the process 550 may be executed by the controller 418, in other examples the process 550 may be executed by one or both of the controllers 132*a*, 132*b*.

At act 552, the controller 418 determines that the power source 404 is providing power to the power devices 406-410. The process 550 may then continue to act 554.

At act 554 the controller 418 selects two or more of the power devices 406-410 to generate pulses of current. At least one of the power devices 406-410 selected is a device that has a non-conducting thyristor, and at least one of the power devices 406-410 selected is a device that has a conducting thyristor. In some examples, the controller 418 may select multiple of the power devices 406-410 that have non-conducting thyristors and/or multiple of the power devices 406-410 that have conducting thyristors. Any number of the power devices 406-410 may be selected provided that the current generated by the first and second groups (the first group being the power devices with conducting thyristors and the second group being power devices with non-conducting thyristors) is equal in magnitude and opposite in polarity. The process 550 may then continue to act 556.

At act 556, the controller 418 instructs and/or controls the first group to generate a "positive" first pulse of current and the second group to generate a "negative" first pulse of current. The "positive" and "negative" pulses of current have equal magnitude but opposite polarity (that is, the "negative" first pulse has a phase angle 180 degrees offset the phase angle of the "positive" first pulse). The process 550 may then continue to act 558.

At act 558, the controller 418 determines whether a delay period of time has expired. The delay period may be based on zero crossings of the voltage of the power provided by the power source 404 (for example, the power source 104 of FIG. 1). The delay period may also be based on a phase angle or degree, a preset or configurable time period, and so forth. If the delay period has expired (558 YES), the process may continue to act 560. If the delay period has not expired (558 NO), the process may wait for the expiration of the delay period.

At act 560, the controller 418 instructs and/or controls the first group to generate a "negative" second pulse of current and the second group to generate a "positive" second pulse of current. The "positive" and "negative" pulses of current have equal magnitude but opposite polarity (that is, the "negative" second pulse has a phase angle 180 degrees offset from the phase angle of the "positive" second pulse).

With respect to FIGS. 5A and 5B, "negative" and "positive" do not necessarily indicate the polarity of a voltage with respect to neutral. For example, a "positive" pulse of current is not necessarily associated with a voltage greater than zero. Instead, "positive" and "negative" represent that the "positive" and "negative" pulses are inverses of one another with respect to at least one circuit node, such as the node A.

Figure 6:
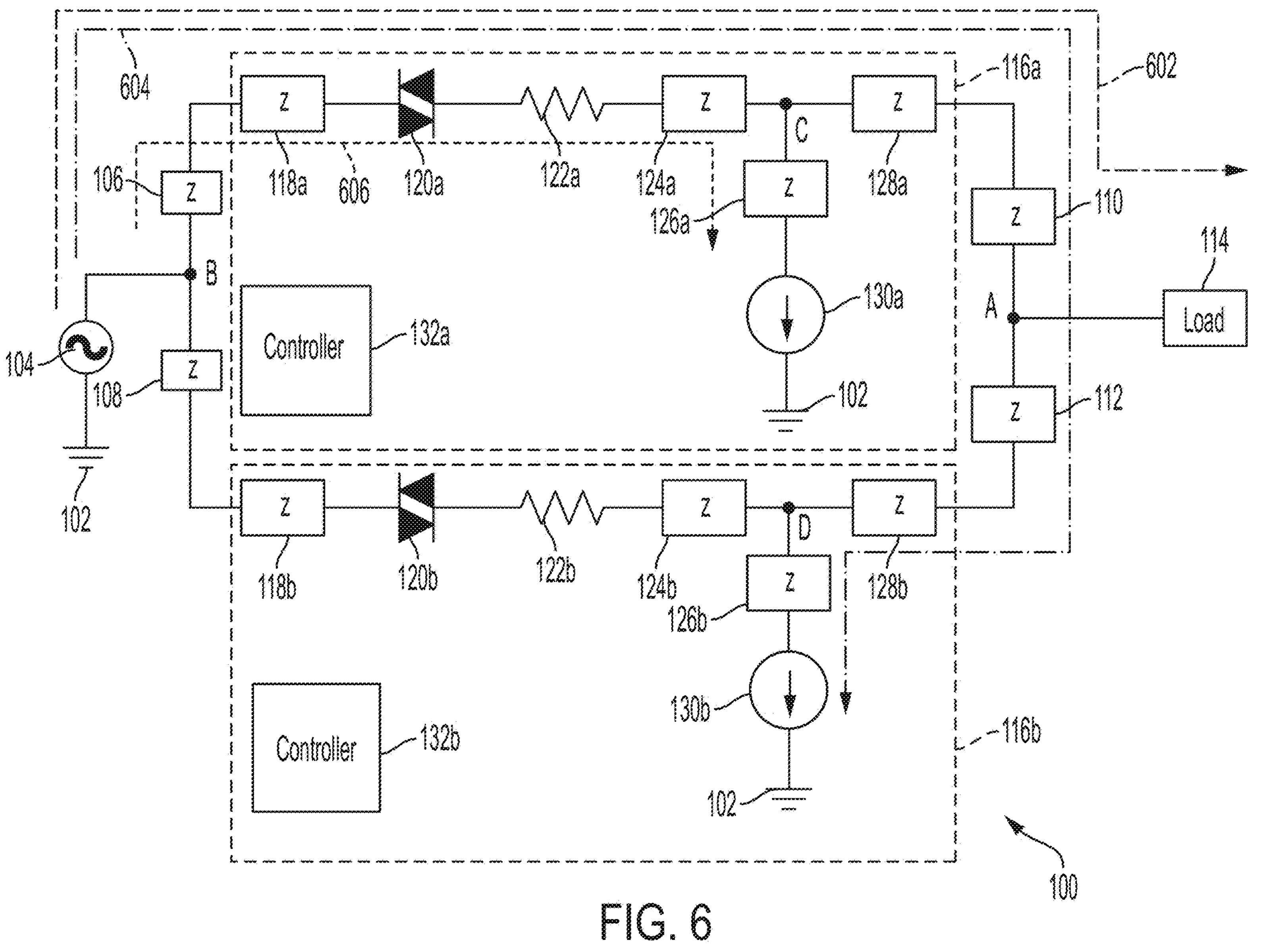
FIG. 6 illustrates a schematic diagram of a power system according to an example.

FIG. 6 illustrates a schematic diagram of the power system 100 of FIG. 1 with three traces according to an example. In contrast to FIG. 3, the power system 100 of FIG. 6 is shown providing current such that the bias current used to turn on the non-conducting thyristors is drawn from the power source 104. This version of the power system 100 may also facilitate the turn on of parallel thyristors with a simpler control compared to the system of FIG. 3 because it may not be necessary to determine, prior to providing biasing current, which parallel thyristors are or are not conducting. Furthermore, the pulse amplitude of the biasing current may also be less, but the power source 104 and load 114 may be exposed to some distortions due to the current pulses. In some examples, a reactive sinusoidal current may be implemented instead of a current pulse to facilitate turn on of one or more parallel thyristors.

FIG. 6 includes a first trace 602, a second trace 604, and a third trace 606. The first trace 602 corresponds to current ("$I_1$") provided by the power source 104 to the load 114. The second trace 604 corresponds to current ("$I_2$") consumed by the second current source 130*b*. The third trace 606 corresponds to current ("$I_3$") consumed by the first current source 130*a*. The first current source 130*a* directs current to the reference node 102, and thus is providing current in the opposite direction compared to the example of FIG. 3.

In some examples, the following equations may indicate the relationship of voltages in the power system 100 when the second thyristor 120*b* is not conducting based on the foregoing example:

$$V_1 = V_{th} + (I_1 + I_2 + I_3)\cdot(Z_{c1} + R_{a1} + Z_{a1} + Z_{a2}) \tag{5}$$

$$V_2 = (I_1 + I_2)\cdot(Z_{a3} + Z_{c3}) \tag{6}$$

$$V_3 = -I_2\cdot(Z_{c4} + Z_{b3}) \tag{7}$$

$$V_4 = V_1 + V_2 - V_3 \tag{8}$$

where $V_1$ is the voltage across nodes B and C, $V_2$ is the voltage drop across nodes C and A, $V_3$ is the voltage drop across nodes A and D, and $V_4$ is the voltage drop across nodes B and D (which may, in some examples, be equal to a voltage drop across the second thyristor 120*b*). $I_1$ is the current represented by the first trace 602, and $I_2$ is the current represented by the second trace 604, and $I_3$ is the current represented by the third trace 306. $V_{th}$ is the voltage drop across the first thyristor 120*a*. $Z_{c1}$ is the impedance of the first impedance 106. $R_{a1}$ is the resistance of the first resistance 122*a*, $Z_{a1}$ is the impedance of the first input impedance 118*a*, $Z_{a2}$ is the impedance of the first line impedance 124*a*. $Z_{a3}$ is the impedance of the first output impedance 128*a* and $Z_{c3}$ is the impedance of the third impedance 110. $Z_{c4}$ is the impedance of the fourth impedance 112 and $Z_{b3}$ is the impedance of the second output impedance 128*b*.

In contrast to the power system 100 in FIG. 3, where the current generated by the current sources 130*a*, 130*b* was not seen by the load 114 and the power source 104, the load 114 and power source 104 may see the current drawn by the current sources 130*a*, 130*b* in the example of FIG. 6. In the power system 100 of FIG. 3, when the current sources 130*a*, 130*b* generate pulses of current to turn on the second thyristor 120*b* (which is assumed not to be conducting for the purposes of this explanation), those pulses appear in the current (and power) provided by the power source 104. The result is that the input power from the input power source 104 and the load 114 may experience distortions due to the pulses.

The current generated by the first current source 130*a* may be equal to the current generated by the second current source 130*b*. However, in contrast to FIG. 3, the current at node B in FIG. 6 is the sum of $I_1$, $I_2$, and $I_3$ because the sum of the current sourced from the current sources 130*a*, 130*b* is not zero. The current at node A remains equal to the sum of $I_1$ and $I_2$. Only at node D does the current fall to equal $I_2$. In other words, of the total current provided from node B to the load 114 via nodes C and A, a first portion (equal to $I_3$) of the total current is drawn away by the first current source 130*a* at node C and a second portion (equal to $I_2$) of the total current is drawn away by the second current source 130*b* at node A, while the remaining portion (equal to $I_1$) is provided to the load 114. The directions of $I_1$, $I_2$ and $I_3$ indicate that the voltage will decrease from node B to node A and increase from node D to A. Furthermore, because the second thyristor 120*b* is off there is no voltage droop across the impedances 108, 118*b*, 122*b* and 124*b*. Thus, increasing the voltage across the second thyristor 120*b* from node B to node D can cause the second thyristor 120*b* to turn on.

Figure 7:
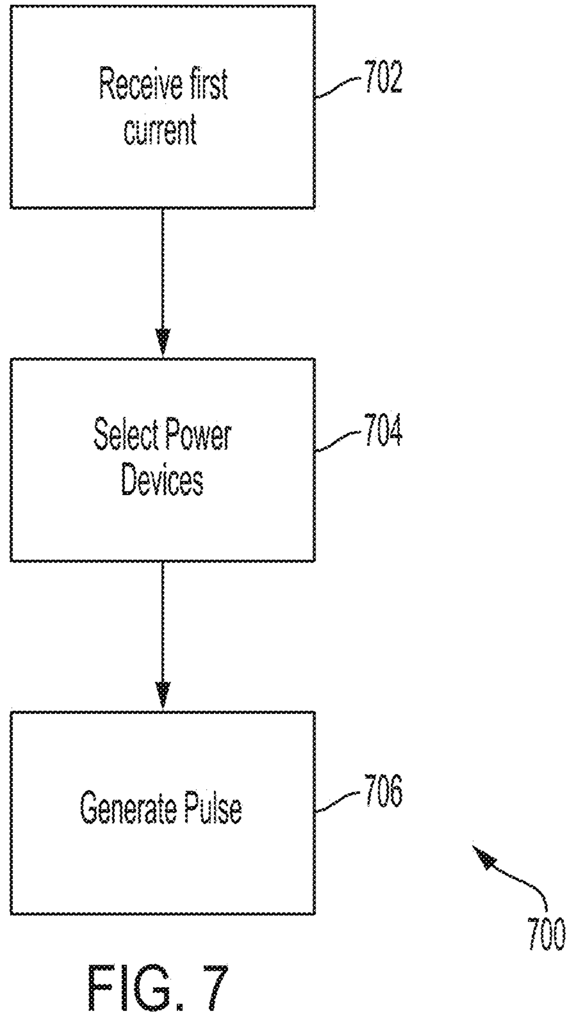
FIG. 7 illustrates a process for turning on a thyristor according to an example.

FIG. 7 illustrates a process 700 for managing current in power devices to ensure that one or more thyristors turn on. In contrast to the processes 500, 550 of FIGS. 5A and 5B, the process 700 involves directing current from node B to C and from node B to node D such that the bias current to turn on the non-conducting parallel thyristors 120*a*, 120*b* is drawn from the power source 104.

In particular, with respect to the process 700, the currents generated by the current sources 130*a*, 130*b* of the power devices 116*a*, 116*b* are now all directed toward the reference node 102. Using FIGS. 3 and 6 as an example, in FIG. 3 the first current source 130*a* directs current from the reference node 102 to node C, which is consistent with the processes 500, 550 of FIGS. 5A and 5B. By contrast, in FIG. 6, the current source 130*a* directs current from node C to the reference node 102, which is consistent with the process 700. Thus, the current entering node C of FIG. 6 equals $I_1+I_2+I_3$, the current entering node A equals $I_1+I_2$, and the current entering node D equals $I_2$. The load receives the current $I_1$, but can also experience distortions due to the current pulses generated by the current sources 130*a*, 130*b*.

At act 702, the controller 418 receives a signal or otherwise detects that a power source 404 is providing power to one or more of the power devices 406-410. The process 700 may then continue to act 704.

At act 704, the controller 418 selects one or more of the power devices 406-410 to provide a first pulse of current. The power devices may be selected at random according to a random or pseudorandom algorithm, or may be selected based on the conducting state of a thyristor associated with the respective power device. In examples where the power devices are selected based on a conducting state of a thyristor, at least one of the power devices selected may have a thyristor in a non-conducting state, and at least one of the power devices selected may have a thyristor in a conducting state. The process 700 may then continue to act 706.

At act 706, the controller 418 controls and/or instructs the selected power devices to generate a pulse. In some examples, the pulse generated by each power device may be equal to the pulse generated by each other power device. In some examples, a current source, such as an inverter or converter of the power device, may generate a respective pulse. The pulse may be generated such that the current of the pulse is directed toward the reference node 402 and away from the load 412 (for example, toward reference node 102 of FIG. 6 and away from the load 114 of FIG. 6). In some examples, the pulse may have a phase angle 90 degrees different relative to the input current provided by the power source 104. As a result, the current entering node B of FIG. 4 may equal the sum of the current to be provided to the load 412 and the current drawn by the power devices 406-410 having non-conducting thyristors. The power devices 406-410 having conducting thyristors may draw current from the current provided from node A to node B and provide that current to the reference node 402, thus reducing the overall current entering node B.

As mentioned above, FIG. 2 illustrates a schematic diagram of a power system 200 according to an example. FIG. 2 is similar to FIG. 1 with some exceptions, including the implementation of transformers, as discussed below. The power system 200 ensures that the thyristors of the power devices discussed below turn on at the same time (or approximately the same time).

The power system 200 includes a first transformer having a first primary winding (or coil) 202*a* ("first primary 202*a*") and a first secondary winding (or coil) 204*a* ("first secondary 204*a*"), as well as at least one first control circuit 206*a* ("first control circuit 206*a*") coupled to the first transformer. The power system 200 also includes a second transformer having a second primary winding (or coil) 202*b* ("second primary 202*b*") and a second secondary winding (or coil) 204*b* ("second secondary 204*b*"), as well as at least one second control circuit 206*b* ("second control circuit 206*b*") coupled to the second transformer.

The power system 200 of FIG. 2 differs from the power system 100 of FIG. 1 at least in that, in the power system 200 of FIG. 2, the first input impedance 118*a* is coupled at the second connection to the first thyristor 120*a* and at the first connection to the first primary 202*a*. The first primary 202*a* is coupled to the first impedance 106 at a first connection, is coupled to the first input impedance 118*a* at a second connection, and is magnetically coupled to the first secondary 204*a*. Furthermore, the second input impedance 118*b* is coupled at the second connection to the second thyristor 120*b* and at the first connection to the second primary 202*b*. The second primary 202*b* is coupled to the second impedance 108 at a first connection, is coupled to the second input impedance 118*b* at a second connection, and is magnetically coupled to the second secondary 204*b*. The input impedances 118*a*, 118*b* are not directly coupled to either the first impedance 106 or the second impedance 108. The source impedances 126*a*, 126*b* and current sources 130*a*, 130*b* are optional and may be replaced with an open circuit and/or removed entirely.

In each transformer, the primaries 202*a*, 202*b* are electromagnetically coupled to their respective secondaries 204*a*, 204*b*. The first secondary 204*a* is coupled to the first control circuit 206*a*, and the second secondary 204*b* is coupled to the second control circuit 206*b*. In some examples, the transformer include a magnetic core wrapped around a busbar and may be electromagnetically coupled to a respective primary 202*a*, 202*b* and/or secondary 204*a*, 204*b*.

The control circuits 206*a*, 206*b* may control one or more power sources configured to provide current to the secondaries 204*a*, 204*b*. In some examples, the control circuits 206*a*, 206*b* may include respective power sources and may provide the current to the secondaries 204*a*, 204*b*. The control circuits 206*a*, 206*b* may control the power sources to provide a sinusoidal signal, a square wave, a triangle wave, or any other type of AC power, current, and/or voltage to the secondaries 204*a*, 204*b*. The control circuits 206*a*, 206*b* may include respective H-bridge circuits that may be used to control the provision of power, current, and/or voltage to the secondaries 204*a*, 204*b*. When an alternating power, current, and/or voltage is received by the secondaries 204*a*, 204*b*, a corresponding voltage and current is induced on the primaries 202*a*, 202*b*.

Figure 8:
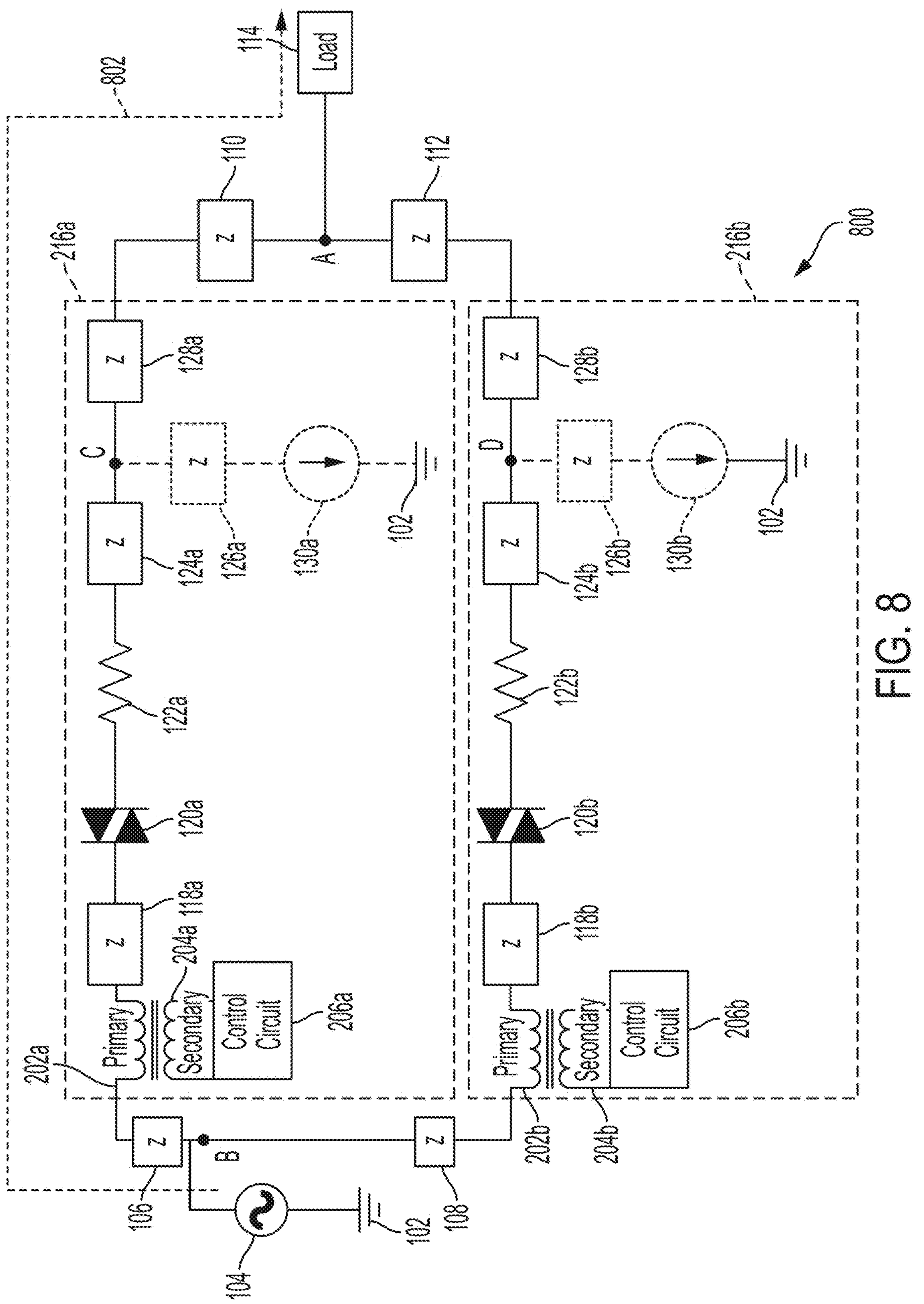
FIG. 8 illustrates a schematic diagram of a power system according to an example.

FIG. 8 illustrates the power system 200 with a trace 802 indicating a current according to an example.

The trace 802 represents a current, $I_1$, provided from the power source 104 to the load 114. In contrast to the examples of FIGS. 3 and 6, only a single trace is shown in FIG. 8. The following equations describe the relationships of certain voltages in the power system 200.

$$V_1 = V_{th} + I_1 \cdot (Z_{c1} + Z_{c3} + R_{a1} + Z_{a1} + Z_{a2} + Z_{a3}) + V_{T1} \quad (9)$$

$$V_2 = V_1 + V_{T2} \quad (10)$$

where $V_1$ is the voltage across nodes B and C, and $V_2$ is the voltage drop across the second thyristor 120*b*. $I_1$ is the current represented by the trace 802. $V_{th}$ is the voltage drop across the first thyristor 120*a*. $Z_{c1}$ is the impedance of the first impedance 106. $R_{a1}$ is the resistance of the first resistance 122*a*, $Z_{a1}$ is the impedance of the first input impedance 118*a*, and $Z_{a2}$ is the impedance of the first line impedance 124*a*. $Z_{a3}$ is the impedance of the first output impedance 128*a* and $Zc_3$ is the impedance of the third impedance 110. $V_{T1}$ is the voltage across the first primary 202*a* and $V_{T2}$ is the voltage across the second primary 202*b*.

The control circuits 206*a*, 206*b* may control respective power provided to the respective secondaries 204*a*, 204*b* to induce respective voltages on the primaries 202*a*, 202*b*. For brevity, controlling the power provided to a secondary may be referred to as controlling the secondary. For example, the first control circuit 206*a* may control the first secondary 204*a* to induce a voltage on the first primary 202*a* by controlling the power provided to the first secondary 204*a*. Likewise, the second control circuit 206*b* may control the second secondary 204*b* to induce a voltage on the second primary 202*b* by controlling the power provided to the second secondary 204*b*. The control circuits 206*a*, 206*b* may use a power source, wave generator, H-bridge, or any other appropriate circuit to provide an alternating or transitory current or voltage to the respective secondaries 204*a*, 204*b* as a means of controlling the secondaries 204*a*, 204*b* to induce voltages on the primaries 202*a*, 202*b*. The voltages induced on the primaries 202*a*, 202*b* can change the voltage across the thyristors 120*a*, 120*b*, and thus can be used to cause the thyristors 120*a*, 120*b* to conduct in either direction (that is, to allow current to pass from the input impedances 118*a*, 118*b* to the resistances 122*a*, 122*b*, or to pass from the resistances 122*a*, 122*b* to the input impedances 118*a*, 118*b*).

As one example, consider the situation where the first thyristor 120*a* is conducting in the direction from the first input impedance 118*a* to the first resistance 122*a* and the second thyristor 120*b* is not conducting. The control circuit 206*b* may, by controlling an H-bridge or other power source, induce a voltage on the second primary 202*b* via the second secondary 204*b*. Per equation (10), the voltage across the second thyristor 120*b* will increase or decrease by $V_{T2}$, which is the voltage induced on the second primary 202*b*. By adjusting the voltage across the second thyristor 120*b* in this way, the voltage across the second thyristor 120*b* can be made to exceed the threshold voltage of the second thyristor 120*b* and thus cause the second thyristor 120*b* to conduct. In some examples, the first primary 202*a* may be coupled between impedances 106 and 118*a* as illustrated in FIG. 8. In other examples, the first primary 202*a* may be coupled in any other location in series with the first thyristor 120*a*, such as between the first input impedance 118*a* and the first thyristor 120*a*, the first resistance 122*a* and the first line impedance 124*a*, between the output impedance 128*a* and the third impedance 110, or between the first impedance 106 and the first input impedance 118*a*. Similarly, the second primary 202*b* may be coupled in any other location in series with the second thyristor 120*b*, such as between the second input impedance 118*b* and the second thyristor 120*b*, the second resistance 122*b* and the second line impedance 124*b*, the output impedance 128*b* and the fourth impedance 112, or between the second impedance 108 and the second input impedance 118*b*.

Figure 9:
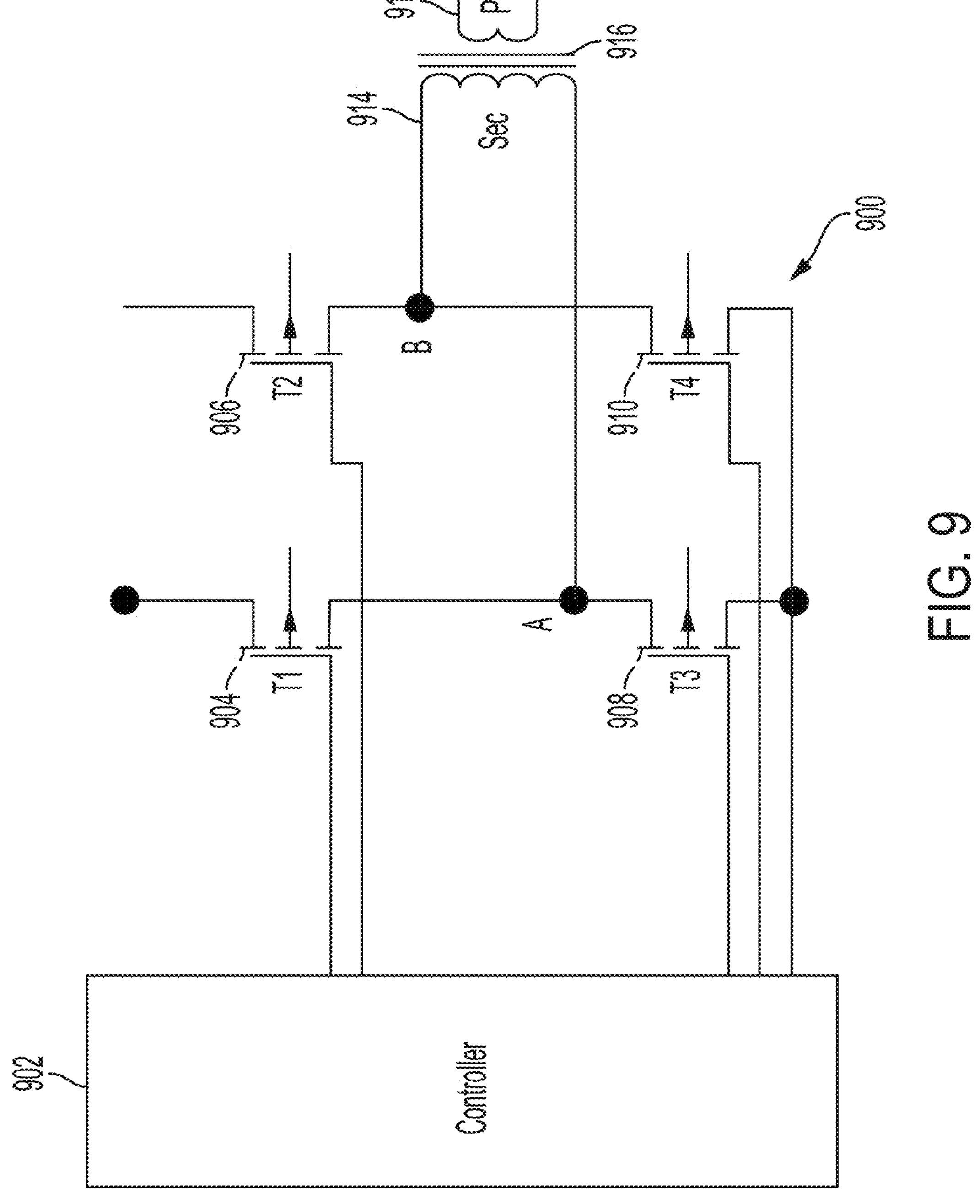
FIG. 9 illustrates a schematic diagram of a control circuit according to an example.

FIG. 9 illustrates a control circuit 900 according to an example. The control circuit 900 is one example implementation of the control circuits 206*a*, 206*b*. The control circuit 900 includes at least one controller 902 ("controller 902"), a first transistor 904, a second transistor 906, a third transistor 908, and a fourth transistor 910. The control circuit 900 may be coupled to a secondary winding 914, a primary winding 912, and a transformer core 916. The control circuit 900 includes two nodes, A and B. Node A is the node between the first transistor 904, the third transistor 908, and the secondary winding 914. Node B is the node between the secondary winding 914, the second transistor 906 and the fourth transistor 910.

The controller 902 is coupled to each transistor 904-910 via the respective control connection of each transistor 904-910. For example, if the transistors 904-910 include field-effect transistors (FETs), the controller 902 may be coupled to a respective gate of each FET. The first transistor 904 is coupled to the second transistor 906 and the controller 902 at a first connection and to the third transistor 908 at a second connection. The second transistor 906 is coupled to the first transistor 904 and the controller 902 at a first connection and to the fourth transistor 910 at a second connection. The third transistor 908 is coupled to the controller 902 and the fourth transistor 910 at a first connection and to the first transistor 904 at a second connection. The fourth transistor 910 is coupled to the third transistor 908 and the controller 902 at a first connection and to the second transistor 906 at a second connection. The secondary winding 914 is coupled to the first and third transistors 904, 908 at a first connection and to the second and fourth transistors 906, 910 at a second connection.

The controller 902 can control the state of the transistors 904-910, which may be operated as switches (that is, the transistors 904-910 may either be conducting current or may not be conducting current). The controller 902 can control the conducting path across the secondary winding 914. For example, the controller 902 can control the first transistor 904 and fourth transistor 910 to be in a conducting state. Current may thus pass through the first transistor 904 to node A, through the secondary winding 914 to node B, and finally through the fourth transistor 910 to the controller 902. The controller 902 can also control the second transistor 906 and third transistor 908 to be in conducting states, such that current passes through the second transistor 906 to node B, through the secondary winding 914 to node A, and then through the third transistor 908 to the controller 902. The above examples illustrate how current through the secondary winding 914 may be in either direction through the secondary winding 914, and thus the voltage induced on the primary winding 912 by the secondary winding 914 may be positive or negative.

Figure 10:
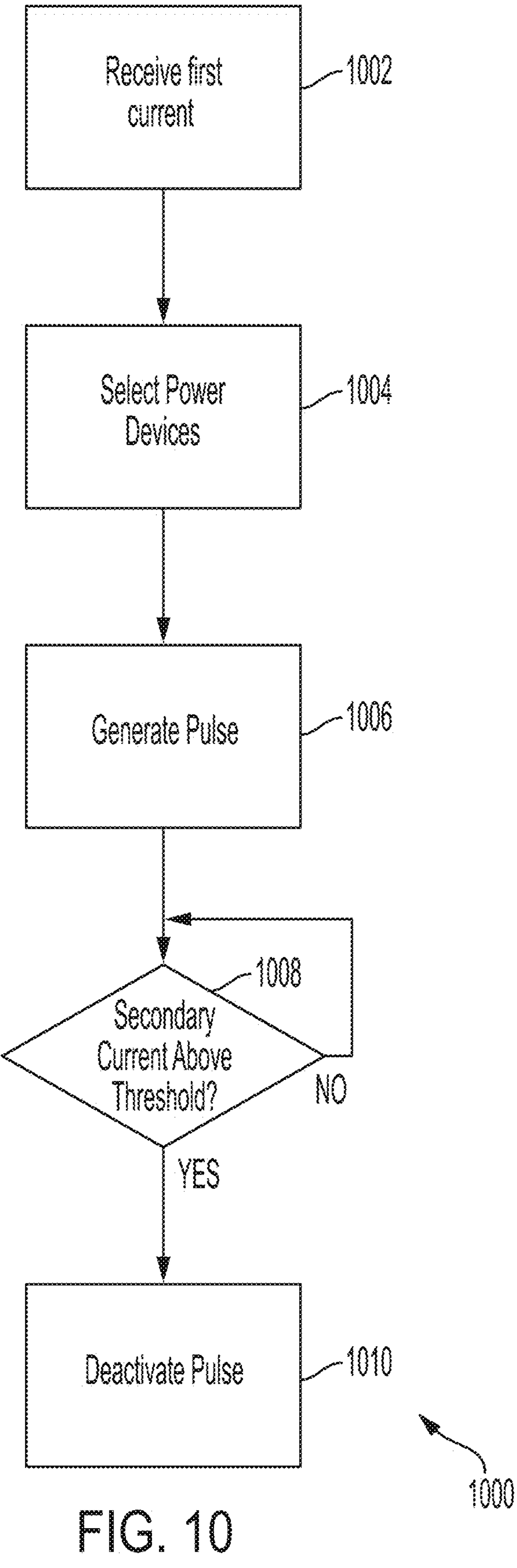
FIG. 10 illustrates a process for turning on a thyristor according to an example.

FIG. 10 illustrates a process 1000 for turning on thyristors in parallel using a transformer, as illustrated in FIG. 2, according to an example.

At act 1002, the controller 418 determines that the power source 404 is providing a current to the load 412. For example, the controller 418 may receive a signal or otherwise detect that the power source 404 is providing power to a load 412. The process 1000 may then continue to act 1004.

At act 1004, the controller 418 may select two or more power devices. The power devices may be selected at random according to a random or pseudorandom algorithm, or may be selected based on the conducting state of thyristors associated with the power devices 406-410. In examples where the power devices 406-410 are selected based on a conducting state of a thyristor, at least one of the power devices 406-410 selected may have a thyristor in a non-conducting state, and at least one of the power devices 406-410 selected may have a thyristor in a conducting state. The process 1000 may then continue to act 1006.

At act 1006, the controller 418 may control a transformer coupled to the thyristors to generate a biasing voltage across the thyristor. In some examples, the controller 418 may control a power source (such as an H-bridge) to provide a time-varying current and/or voltage to the secondary of the transformer, thereby inducing a voltage on the primary of the transformer. The voltage on the primary of the transformer may then cause the voltage across the thyristor coupled to the transformer to change, either increasing or decreasing the voltage, and allowing at least one of the thyristors to begin conducting in at least one direction. The process 1000 may then continue to act 1008.

At act 1008, the controller 418 determines whether the current level through the secondary winding of one of the transformers (preferably the transformer of the power device housing the non-conducting thyristor) reaches a threshold level. In some examples, the threshold level may be based on when the transformer core of one of the transformers (preferably the transformer of the power device housing the non-conducting thyristor) saturates. If the controller 418 determines that the current level though the secondary winding of the transformer is below the threshold level (1008 NO), the process 1000 may continue to wait at act 1008 until the current reaches the threshold level. If the current reaches or exceeds the threshold level (1008 YES), the process 1000 may continue to act 1010.

At act 1010, the controller 418 controls the transformer to stop providing the biasing voltage. In some examples, the controller 418 may control the power source 404 (such as the H-bridge) to stop providing a time-varying current and/or voltage to the secondary of the transformer. Without a time-varying current or voltage, the secondary winding will no longer induce a voltage on the primary winding, thus removing the biasing voltage.

In the foregoing figures, FIGS. 1-10, the power devices 406-410 may be UPSs or similar devices that provide uninterrupted power to one or more loads.

In general, and in particular in FIGS. 5A, 5B, 7, and 10, when a controller is referred to as performing an operation, that controller may perform the operation independently and entirely on its own, or the controller may perform the operation partially or in tandem with other controllers. More generally, although reference is made to controllers throughout, the controllers may function as a single controller making decisions together (a peer network) or may operate in a commander-subordinate manner where one controller makes decisions and the others carry out instructions.

Throughout the foregoing discussion, when pulses are generated, the controller may control the power devices or constituent elements of the power devices to generate those pulses at a time coinciding with or approximately coinciding with a zero crossing of the current and/or voltage of the input power. For example, a pulse may begin being generated starting at a zero crossing, or may end being generated at a zero crossing, or may be generated at another time based on the zero crossing.

Various controllers, such as the controllers 132*a*, 132*b*, 418, 902, may execute various operations discussed above. Using data stored in associated memory and/or storage, the controllers can also execute one or more instructions stored on one or more non-transitory computer-readable media, which the controllers may include and/or be coupled to, that may result in manipulated data. In some examples, the controllers may include one or more processors or other types of controllers. In one example, the controllers are or include at least one processor. In another example, the controllers perform at least a portion of the operations discussed above using an application-specific integrated circuit tailored to perform particular operations in addition to, or in lieu of, a general-purpose processor. As illustrated by these examples, examples in accordance with the present disclosure may perform the operations described herein using many specific combinations of hardware and software and the disclosure is not limited to any particular combination of hardware and software components. Examples of the disclosure may include a computer-program product configured to execute methods, processes, and/or operations discussed above. The computer-program product may be, or include, one or more controllers and/or processors configured to execute instructions to perform methods, processes, and/or operations discussed above.

Having thus described several aspects of at least one embodiment, it is to be appreciated various alterations, modifications, and improvements will readily occur to those skilled in the art. Such alterations, modifications, and improvements are intended to be part of, and within the spirit and scope of, this disclosure. Accordingly, the foregoing description and drawings are by way of example only.

What is claimed is:

1. A system comprising:

an input configured to be coupled to a power source;

an output configured to be coupled to a load;

a first branch coupled between the input and the output and including a first thyristor having a first threshold voltage;

a second branch coupled between the input and the output and coupled in parallel with the first branch, the second branch including a second thyristor having a second threshold voltage higher than the first threshold voltage;

a first current source coupled between the second thyristor and the output, the first current source being coupled in a shunt configuration with respect to the second thyristor and a reference node; and at least one controller configured to control the system to selectively generate a biasing voltage across the second thyristor to induce a change in a voltage across the second thyristor from a first voltage to a second voltage, the first voltage being less than the second threshold voltage and the second voltage being greater than the second threshold voltage.

2. The system of claim 1 wherein the biasing voltage is provided responsive to the system receiving an input voltage at the input.

3. The system of claim 1 further comprising a transformer coupled in series with the second thyristor.

4. The system of claim 3 wherein, in controlling the system to generate the biasing voltage, the at least one controller is further configured to control the transformer to induce a change in a voltage across the second thyristor from the first voltage to the second voltage.

5. The system of claim 4 wherein the transformer includes a secondary winding, and wherein controlling the transformer includes controlling a voltage source to provide power to the secondary winding.

6. The system of claim 3 further comprising at least one busbar, wherein the transformer comprises a magnetic core surrounding the at least one busbar, the magnetic core being electromagnetically coupled to a primary winding and a secondary winding.

7. The system of claim 1 wherein the change in the voltage across the second thyristor is equal to or greater than a sum of changes in voltages across one or more other thyristors coupled to one or more branches, each branch of the one or more branches being coupled in parallel with the second branch between the input and the output.

8. The system of claim 1 further comprising:

a second current source coupled in a shunt configuration with respect to the first thyristor and the reference node.

9. The system of claim 8 wherein the at least one controller is further configured to:

control the first current source to output a first current having a first phase and magnitude; and control the second current source to output a biasing current having a second phase and magnitude, wherein the biasing current is generated to cancel out the first current at the output.

10. The system of claim 9 wherein the biasing current is generated to induce a change in a voltage across the second thyristor from the first voltage to the second voltage by an amount equal to the biasing voltage.

11. The system of claim 9 wherein the first phase is 180 degrees out-of-phase with the second phase.

12. The system of claim 8 wherein the input is configured to receive an input current from the power source, and wherein the at least one controller is further configured to:

output a request to the power source to increase the input current provided at the input;

control the first current source to provide a first current having a first phase and a first magnitude; and control the second current source to provide a biasing current having a second phase and a second magnitude.

13. The system of claim 12 wherein a sum of the first magnitude and the second magnitude equals an amount of the increase of the input current provided at the input.

14. The system of claim 8 wherein the first current source is a first inverter and the second current source is a second inverter.

15. The system of claim 1 wherein the at least one controller controls a current source to generate a biasing current to induce a voltage change equal to the biasing voltage across the second thyristor such that a new voltage across the second thyristor is greater than the second threshold voltage.

16. A non-transitory computer-readable medium containing computer-readable instructions for a power system, the instructions instructing at least one processor to:

responsive to an input current being provided to a first thyristor, control a current source coupled between a second thyristor and an output, the current source coupled in a shunt configuration with respect to the second thyristor and a reference node, to provide a biasing voltage across the second thyristor to induce a change in a voltage across the second thyristor from a first voltage to a second voltage, the second voltage being greater than a threshold voltage of the second thyristor.

17. The non-transitory computer-readable medium of claim 16 wherein the instructions further instruct the at least one processor to:

control a power source to provide a time-varying voltage to a secondary winding of a transformer coupled in series with the second thyristor.

18. The non-transitory computer-readable medium of claim 17 wherein controlling the transformer to provide the biasing voltage across the second thyristor includes controlling the current source to provide a biasing current to a node coupled between the second thyristor and an output.

19. The non-transitory computer-readable medium of claim 18 wherein the instructions instruct the at least one processor to select a value of the biasing current provided to the node such that a corresponding voltage drop across the second thyristor is greater than the threshold voltage of the second thyristor.

20. The non-transitory computer-readable medium of claim 18 wherein the node is a second node and the instructions further instruct the at least one processor to:

control a first current source to provide a first current to a first node, the first node coupled between the output and the first thyristor; and control a second current source to provide the biasing current to the second node.

21. The non-transitory computer-readable medium of claim 20 wherein the instructions further instruct the at least one processor to:

control the first current source to provide the first current and the second current source to provide the biasing current such that the first current and the biasing current cancel each other at the output.

22. The non-transitory computer-readable medium of claim 20 wherein the instructions further instruct the at least one processor to:

control an input power source to increase an input current by an additional amount, and provide the input current increased by the additional amount to the first thyristor, wherein a sum of the first current and the biasing current equals the additional amount of the input current.

23. A method of operating a first thyristor and a second thyristor coupled in parallel, the method comprising:

providing a voltage associated with a current to the first thyristor and the second thyristor; and providing, via a current source coupled between the second thyristor and an output, the current source coupled in a shunt configuration with respect to the second thyristor and a reference node, a biasing voltage across the second thyristor to induce a change in a voltage across the second thyristor from a first voltage to a second voltage, the first voltage being less than a threshold voltage of the second thyristor and the second voltage being greater than the threshold voltage.

* * * * *